United States Patent
Feller (10) Patent No.: US 9,120,954 B2
(45) Date of Patent: Sep. 1, 2015

(54) METHOD, APPARATUS, AND KIT FOR PROTECTING AN ELECTRONIC DEVICE

(71) Applicant: NLU Products, L.L.C., Draper, UT (US)

(72) Inventor: Kirk Feller, Draper, UT (US)

(73) Assignee: NLU Products, L.L.C., Lehi, UT (US)

( * ) Notice: Subject to any disclaimer, the term of this patent is extended or adjusted under 35 U.S.C. 154(b) by 255 days.

(21) Appl. No.: 13/787,193

(22) Filed: Mar. 6, 2013

(65) Prior Publication Data

US 2013/0199950 A1 Aug. 8, 2013

Related U.S. Application Data

(63) Continuation-in-part of application No. 13/763,385, filed on Feb. 8, 2013, now abandoned.

(60) Provisional application No. 61/596,611, filed on Feb. 8, 2012.

(51) Int. Cl.
*B29C 65/48* (2006.01)
*B32B 37/26* (2006.01)
*B32B 43/00* (2006.01)
*C09J 7/02* (2006.01)
*H05K 5/03* (2006.01)
*H05K 13/00* (2006.01)
*C09J 5/00* (2006.01)
(Continued)

(52) U.S. Cl.
CPC .... *C09J 7/02* (2013.01); *C09J 5/00* (2013.01); *H05K 5/02* (2013.01); *H05K 5/03* (2013.01); *H05K 13/00* (2013.01); *H04B 1/3888* (2013.01); *Y10T 428/14* (2015.01)

(58) Field of Classification Search
CPC ................ C09J 7/02; C09J 5/00; H05K 5/02; H05K 5/03; H05K 13/00; H05K 13/0015; H04B 1/3888; B05D 5/08; B32B 7/06; B32B 37/26; B32B 2037/268; B29C 66/004
USPC .......................... 156/230, 234, 237, 247, 289
See application file for complete search history.

(56) References Cited

U.S. PATENT DOCUMENTS 5,592,241 A * 1/1997 Kita et al. ....................... 348/823
6,250,765 B1 * 6/2001 Murakami ..................... 359/609

(Continued)

FOREIGN PATENT DOCUMENTS

DE 102009052511 A1 * 5/2011
WO WO 2006084865 A2 * 8/2006

OTHER PUBLICATIONS

English Abstract of DE 102009052511 (Jan. 9, 2015).*

*Primary Examiner* — Sing P Chan
(74) *Attorney, Agent, or Firm* — Thorpe North & Western, LLP (57) ABSTRACT

A method, apparatus, and kit for protecting an electronic device is disclosed and described. The apparatus can include a protective film with an adhesive disposed on one side thereof and a backing covering the adhesive. The adhesive can be configured to bond to a surface of the device and can be configured to allow an optional gel to temporarily deactivate bonding of the protective film to the surface of the device. The backing can comprise a tab in order for a portion of the backing to be removed from the protective film. Additionally, the protective film can have anti-microbial properties on an exposed surface.

9 Claims, 7 Drawing Sheets

(51) Int. Cl.
*H05K 5/02* (2006.01)
*H04B 1/3888* (2015.01)

(56) References Cited

U.S. PATENT DOCUMENTS

| | | | | |
|---|---|---|---|---|
| 6,469,752 B1* | 10/2002 | Ishikawa et al. | ............... | 348/834 |
| 6,491,775 B1* | 12/2002 | Janssen et al. | ................ | 156/108 |
| 6,536,589 B2* | 3/2003 | Chang | ............................ | 206/320 |
| 6,555,235 B1* | 4/2003 | Aufderheide et al. | ......... | 428/447 |
| 7,495,895 B2* | 2/2009 | Carnevali | .................. | 361/679.26 |
| 8,044,942 B1* | 10/2011 | Leonhard et al. | .............. | 345/173 |
| 8,369,072 B1* | 2/2013 | Alonzo et al. | ............ | 361/679.01 |
| 8,567,596 B1* | 10/2013 | Mason, Jr. | ...................... | 206/230 |
| 8,675,353 B1* | 3/2014 | Alonzo et al. | ............ | 361/679.01 |
| 2003/0012936 A1* | 1/2003 | Draheim et al. | .............. | 428/216 |
| 2003/0110613 A1* | 6/2003 | Ross | ................................. | 29/592 |
| 2004/0246386 A1* | 12/2004 | Thomas et al. | ............... | 348/818 |
| 2006/0099374 A1* | 5/2006 | Dureiko | ............................ | 428/43 |
| 2006/0186001 A1* | 8/2006 | Anderson et al. | .............. | 206/320 |
| 2006/0222801 A1* | 10/2006 | Mase | ............................ | 428/40.1 |
| 2007/0019300 A1* | 1/2007 | Wilson et al. | ................. | 359/642 |
| 2007/0021068 A1* | 1/2007 | Dewhurst | ........................ | 455/42 |
| 2007/0212508 A1* | 9/2007 | Mase | ............................ | 428/40.1 |
| 2007/0229961 A1* | 10/2007 | Englander | .................... | 359/604 |
| 2008/0302456 A1* | 12/2008 | Cook | ............................... | 150/154 |
| 2009/0059481 A1* | 3/2009 | Taylor | ............................ | 361/679 |
| 2009/0087655 A1* | 4/2009 | Yamada et al. | ............... | 428/354 |
| 2009/0181229 A1* | 7/2009 | Mase | ............................ | 428/214 |
| 2009/0186181 A1* | 7/2009 | Mase | ............................ | 428/40.1 |
| 2009/0214829 A1* | 8/2009 | Chevallier | .................... | 428/157 |
| 2009/0310907 A1* | 12/2009 | Ikeda et al. | ..................... | 385/14 |
| 2010/0270189 A1* | 10/2010 | Pedersen et al. | .............. | 206/320 |
| 2011/0187947 A1* | 8/2011 | Tsanev et al. | ................. | 348/841 |
| 2011/0267793 A1* | 11/2011 | Cohen et al. | .................. | 361/807 |
| 2011/0279383 A1* | 11/2011 | Wilson et al. | ................. | 345/173 |
| 2011/0283443 A1* | 11/2011 | Simpson | ........................... | 2/424 |
| 2011/0285932 A1* | 11/2011 | Park | ................................ | 349/56 |
| 2011/0293870 A1* | 12/2011 | Lin et al. | ...................... | 428/41.8 |
| 2012/0043015 A1* | 2/2012 | Feller | ........................... | 156/247 |
| 2012/0057287 A1* | 3/2012 | Chaves et al. | ............. | 361/679.3 |
| 2012/0076967 A1* | 3/2012 | Muramatsu | ................. | 428/41.8 |
| 2012/0110868 A1* | 5/2012 | Abbondanzio | ................. | 33/645 |
| 2012/0141735 A1* | 6/2012 | Chevallier et al. | ............ | 428/141 |
| 2012/0141739 A1* | 6/2012 | Chevallier et al. | ............ | 428/156 |
| 2012/0188743 A1* | 7/2012 | Wilson et al. | ................. | 361/816 |
| 2012/0211171 A1* | 8/2012 | Patel et al. | ..................... | 156/538 |
| 2013/0029077 A1* | 1/2013 | Yoon | ............................ | 428/41.8 |
| 2013/0045371 A1* | 2/2013 | O'Donnell | ..................... | 428/215 |
| 2013/0129958 A1* | 5/2013 | Li | ................................ | 428/41.7 |
| 2013/0142981 A1* | 6/2013 | Huang | ......................... | 428/41.8 |
| 2013/0224425 A1* | 8/2013 | Yamazaki et al. | ............. | 428/78 |
| 2013/0256160 A1* | 10/2013 | Ore-Yang | ....................... | 206/37 |
| 2013/0280463 A1* | 10/2013 | On et al. | .......................... | 428/38 |
| 2013/0316112 A1* | 11/2013 | Leonhard et al. | ............. | 428/38 |
| 2014/0041799 A1* | 2/2014 | Nam | ............................. | 156/247 |
| 2014/0043748 A1* | 2/2014 | Sartee et al. | ............. | 361/679.27 |
| 2014/0072749 A1* | 3/2014 | Leonhard et al. | ............. | 428/41.7 |
| 2014/0124146 A1* | 5/2014 | Patel et al. | ..................... | 156/574 |
| 2014/0134412 A1* | 5/2014 | O'Donnell | ..................... | 428/215 |
| 2014/0230988 A1* | 8/2014 | Chou | ............................ | 156/60 |
| 2014/0234615 A1* | 8/2014 | Meng | ............................ | 428/332 |
| 2014/0262849 A1* | 9/2014 | Karp et al. | ...................... | 206/37 |
| 2014/0287203 A1* | 9/2014 | Hsu | ................................ | 428/201 |
| 2014/0332417 A1* | 11/2014 | Wicks et al. | .................... | 206/37 |
| 2014/0364178 A1* | 12/2014 | Hynecek et al. | ........... | 455/575.8 |

* cited by examiner

METHOD, APPARATUS, AND KIT FOR PROTECTING AN ELECTRONIC DEVICE

RELATED APPLICATION

This application is a continuation-in-part application of U.S. patent application Ser. No. 13/763,385, filed Feb. 8, 2013 which claims the benefit of U.S. Provisional Application No. 61/596,611, filed Feb. 8, 2012 and which are each incorporated herein by reference.

FIELD OF THE INVENTION

The present invention relates generally to protective films and, more particularly, to protective films for electronic devices.

BACKGROUND

Portable electronic devices, or mobile devices, have become prevalent in today's society and are widely used for communication, information retrieval, scheduling, and entertainment, among others. Frequently, users of electronic devices subject the devices to conditions or environments that can result in damage to the devices. Additionally, in the course of use, many devices are dropped, kicked, thrown, etc. Meanwhile, electronic devices may not be designed to withstand such use, which can result in damage to the devices. For example, touch screen technology is becoming increasingly common in today's electronic devices. Touch screens are routinely exposed and vulnerable to scratches, impacts, etc. Protective films can provide protection for an electronic device under a wide variety of potentially harmful conditions while, at the same time, be unobtrusive to use on the device and largely maintain functionality of the device.

For these and other reasons, it is desirable to provide protection for electronic devices with a protective film.

SUMMARY

An improved method, apparatus, and kit for protecting an electronic device is disclosed and described. The apparatus can include a protective film with an adhesive disposed on one side thereof and a backing covering the adhesive. The adhesive can be configured to bond to a surface of the device and can be configured to allow the use of an optional gel configured to temporarily deactivate bonding of the protective film to the surface of the device to allow for positioning of the film. The backing can comprise a tab in order for a portion of the backing to be removed from the protective film. Additionally, the protective film can have anti-microbial properties on an exposed surface.

In one aspect, a method for applying protective film to a device is provided. The method can comprise obtaining a protective film having an adhesive disposed thereon and a backing covering the adhesive, removing the backing to expose the adhesive, applying a gel to the adhesive, aligning the protective film on the device, and applying the protective film to the device after the protective film is properly aligned.

In one aspect, a kit for protecting a device can comprise a protective film having an adhesive disposed thereon and a backing covering the adhesive, a gel packet containing gel for optionally applying to the adhesive, and an instruction sheet for providing instructions for a dry application of the protective film to the device through direct attachment and instructions for a wet application of the protective film to the device using the gel.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

Features and advantages of the invention will be apparent from the detailed description that follows, and which taken in conjunction with the accompanying drawings, together illustrate features of the invention. It is understood that these drawings merely depict exemplary embodiments and are not, therefore, to be considered limiting of its scope. And furthermore, it will be readily appreciated that the components, as generally described and illustrated in the figures herein, could be arranged and designed in a wide variety of different configurations.

DETAILED DESCRIPTION

Reference will now be made to exemplary embodiments and specific language will be used herein to describe the same. It will nevertheless be understood that no limitation of the scope of the present invention is thereby intended. Alterations and further modifications of the inventive features described herein, and additional applications of the principles of the invention as described herein, which would occur to one skilled in the relevant art and having possession of this disclosure, are to be considered within the scope of the invention. Further, before particular embodiments are disclosed and described, it is to be understood that this invention is not limited to the particular process and materials disclosed herein as such may vary to some degree. It is also to be understood that the terminology used herein is used for the purpose of describing particular embodiments only and is not intended to be limiting, as the scope of the present invention will be defined only by the appended claims and equivalents thereof.

It must be noted that, as used in this specification and the appended claims, the singular forms "a," "an," and "the" include plural referents unless the context clearly dictates otherwise. Thus, for example, reference to "a protective film" includes one or more of such protective films and reference to "a cut out" includes reference to one or more of such cut outs.

In describing and claiming the present invention, the following terminology will be used in accordance with the definitions set forth below.

As used herein, "substantial" when used in reference to a quantity or amount of a material, or a specific characteristic thereof, refers to an amount that is sufficient to provide an effect that the material or characteristic was intended to provide. The exact degree of deviation allowable may in some cases depend on the specific context. Similarly, "substantially free of" or the like refers to the lack of an identified element or agent in a composition. Particularly, elements that are identified as being "substantially free of" are either completely absent from the composition, or are included only in amounts which are small enough so as to have no measurable effect on the composition.

As used herein, "about" refers to a degree of deviation based on experimental error typical for the particular property identified. The latitude provided the term "about" will depend on the specific context and particular property and can be readily discerned by those skilled in the art. The term "about" is not intended to either expand or limit the degree of equivalents which may otherwise be afforded a particular value. Further, unless otherwise stated, the term "about" shall expressly include "exactly," consistent with the discussion below regarding ranges and numerical data.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

Concentrations, dimensions, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a range of about 1 to about 200 should be interpreted to include not only the explicitly recited limits of 1 and 200, but also to include individual sizes such as 2, 3, 4, and sub-ranges such as 10 to 50, 20 to 100, etc.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Any steps recited in any method or process claims may be executed in any order and are not limited to the order presented in the claims unless otherwise stated. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

Figure 1:
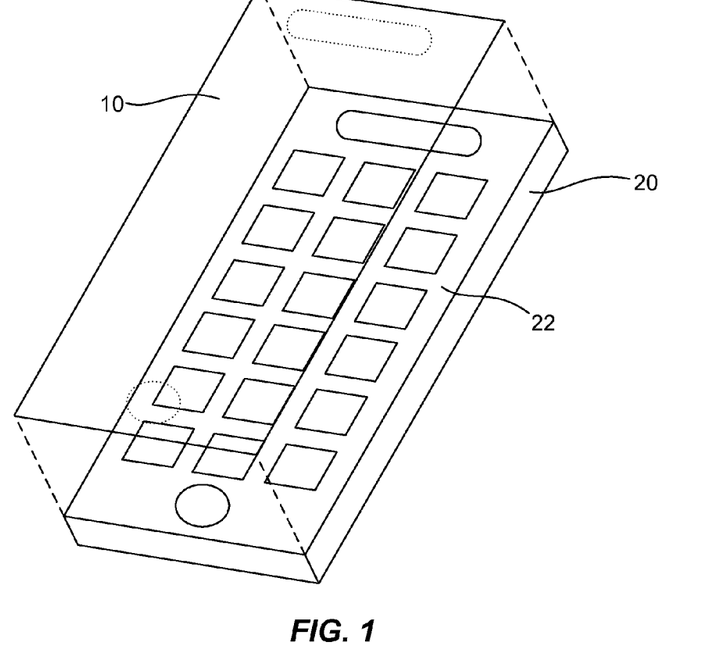
FIG. 1 is a protective film and a device, in accordance with an example of the present disclosure.

With reference to FIG. 1, illustrated are a protective film 10 and a device 20. The protective film 10 can be configured to shield or protect all or a portion of the device 20. For example, the protective film can be applied to a surface of a device, e.g., to protect the screen, paint, or finish, against scratches or staining. In the figure, the protective film is configured to protect a screen 22 of the device 20. The device 20 can be a personal electronic device, a cell phone, a personal digital assistant, a camera, a tablet, a laptop, a calculator, a digital music player, a digital movie player, etc. The device 20 can therefore include features such as a screen, a key, a keypad, a button, a switch, or any other device feature. Accordingly, any or all such features can be protected by the protective film. The protective film can be provided in various shapes to conform to a variety of devices.

In one aspect, the protective film can be applied to a touch screen. In this case, the protective film can be configured to allow the touch screen to function normally despite the presence of the protective film between the screen and the user. Additionally, the protective film can be configured to allow visibility through the protective film. For example, the protective film can be optically clear to permit a user to see an image on a screen, key, or other feature of the device 20. In some embodiments, the protective film can be optically clear prior to application to the device. Additionally, the protective film can be optically clear following application to the device. In another aspect, the protective film can be configured to resist abrasions. Abrasion resistance can help maintain optical clarity of the protective film.

An adhesive can be disposed on a side of the protective film to bond or adhere the protective film to the device. The adhesive can be optically clear prior to application of the protective film on the device. Additionally, the adhesive can be optically clear following application of the protective film to the device. In some cases, the adhesive can exhibit haze immediately following installation which haze substantially subsides as the adhesive cures. Clarity times can vary depending on the adhesive. In one aspect, the adhesive can be configured to allow an optional gel to temporarily deactivate or delay bonding of the protective film to the surface of the device. In another aspect, the protective film and adhesive can be configured to be "dry" applied to the device, without the gel composition. Additionally, the protective film and adhesive can be configured to be "wet" applied to the device using the gel composition. A wet application can allow for repositioning of the protective film after the film has been initially placed on the device by temporarily deactivating the adhesive with the gel composition. A wet application can result in immediate optical clarity of the adhesive when applied to the device. In some embodiments, the protective film and adhesive can be simultaneously configured for both wet and dry applications.

In one aspect, multiple protective films can be applied to a single device. For example, a first protective film can be applied to a screen of the device and a second protective film can be applied to a keypad of the device. Additional supplemental protective films can be provided for a body of the device, e.g., back and sides of the device. In such supplemental protective films, color, designs, or other markings can be printed on the films to provide various aesthetic effects to the device.

Figure 2:
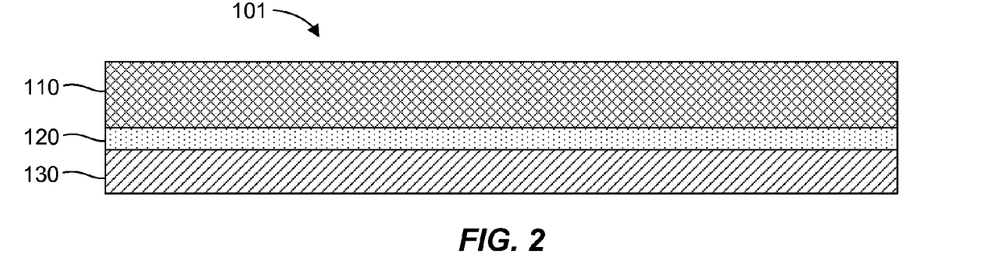
FIG. 2 is a cross-section of a protective film assembly, in accordance with an example of the present disclosure.

With reference to FIG. 2, illustrated is a protective film assembly 101, in accordance with an example of the present disclosure. The protective film assembly can include a protective film 110, and an adhesive 120 that can be disposed on the protective film 110. In one aspect, a removable backing 130 can be provided that shields and protects the adhesive before the protective film is applied to a device. The backing 130 can cover the adhesive 120 of the protective film 110 to prevent undesired adhesion or so that the adhesive 120 does not become contaminated before application to a device. The backing 130 can be removed prior to applying the protective film 110 to a device.

Some desirable characteristics that may be exhibited by the protective film 110 include elasticity, optical clarity, oil and grease resistance, abrasion resistance, high shear strength, and low-temperature performance. Additionally, the protective film can have anti-microbial properties. Non-limiting examples of anti-microbials include ULTRA-FRESH (from Thompson Research), sulphonamides, quinolones, cotrimoxazole, copper, silver, zinc, MICROBAN (a composite antibacterial organometallic product from Microban International), quaternary salts, triclosan, PHMB, zinc pyrithione, tributyl tin, oxybisphenoxarsine, and the like. In one aspect, an antimicrobial can be disposed on the exposed surface of the protective film to provide anti-microbial properties. In another aspect, an antimicrobial can be contained within the protective film material.

In another aspect, the protective film can have a high surface hardness (e.g., around 3H pencil hardness), which can make the film impact resistant and well suited for surface protection of the device.

In some cases, the protective film can be applied to complex geometries and/or curved surfaces. These applications can benefit from a highly conformable, flexible plastic film. Such a film can be highly conformable and flexible and, at the same time, resistant to stretching or other deformation when removed and repositioned on the device. The protective film can comprise, for example, urethane, polyurethane, thermoplastic polyurethane, aliphatic thermoplastic polyurethane, polyvinyl chloride, chlorinated polymer, polyolefin, polyester, polyethylene terephthalate, polyamide, polyacrylate, polysilicone, etc. In a specific aspect, a thickness of the protective film is between about 0.002 inch and about 0.030 inch.

Additionally, the protective film can have a surface treatment that can improve optical clarity due to smoothing of the protective film surface by the treatment materials. In one aspect, the surface treatment can improve chemical resistance, such as resistance to oil, grease, ink, or other chemicals. The surface treatment can be applied to the protective film, such as by gravure coating, spray, flexography, slot die coating, roll coating or other suitable methods. Optionally, the surface coating can be obtained by laser ablation, surface plasma, or other surface modifications. Although specific chemical functionality can vary depending on the type of surface treatment, many of the above options create hydrophilic surface groups which tend to repel oil, ink and other non-aqueous materials. In one aspect, the surface treatment can be flexible and conformable along with the protective film. In another aspect, the surface treatment can be infused into the protective film.

The adhesive layer 120 can be can be configured to bond to the surface of the device and configured to allow an optional gel to temporarily deactivate bonding of the protective film to the surface of the device. In one aspect, the adhesive 120 can comprise a single layer or multiple layers of adhesive that can be of the same or a different composition. Adhesive materials can include polymers designed and formulated to exhibit the requisite viscoelastic properties resulting in a desired balance of tack, peel adhesion, and shear holding power. In a particular aspect, the adhesive can be formulated to be optically clear. The adhesive can also exhibit adhesion to a wide variety of surfaces including metal, glass and polymeric substrates (i.e. plastics).

In one aspect, the adhesive can comprise a pressure sensitive adhesive. A pressure sensitive adhesive can comprise acrylic based polymers, acrylic emulsion polymers, natural elastomeric polymers, synthetic elastomeric polymers, elastomeric copolymer microspheres, vinyl ethers, silicone, or combinations thereof. Suitable pressure sensitive adhesive materials can contain, for example, a polymer as a principal constituent, such as acrylic type polymers, block copolymers, natural or recovered rubbers, styrene butadiene rubbers, ethylene and vinyl acetate random copolymers, ethylene vinyl acrylic terpolymers, polyisobutylene poly(vinyl ethers), etc. In a specific aspect, elastomers used in the adhesive can be based on acrylics, butyl rubber, ethylene-vinyl acetate, natural rubber, nitriles, silicone rubber, styrene block copolymers, styrene-butadiene-styrene, styrene-ethylene/butylene-styrene, styrene-ethylene/propylene, styrene-isoprene-styrene, vinyl ethers, etc. Useful elastomeric polymers that may be incorporated in the adhesive include natural rubber (polyisoprene), polybutadiene, synthetic polyisoprene, random styrenebutadiene polymers, styrene-butadiene block copolymers, multiarmed and repeating (SB) copolymers, styrene-butadiene-styrene block copolymers, styreneisoprene block copolymers, styrene-isoprene-styrene block copolymers, multiarmed styrene-isoprene, block copolymers, and the like. Other elastomers, such as the ethylene-propylene diene rubbers, styrene-ethylene/butylene, styrene block copolymers, styrene-ethylene/propylene-styrene block copolymers, and the like may also be used.

In addition to the aforementioned materials, other materials can be present in the adhesive to impart desired properties. For example, plasticizers, antioxidants, filler materials, and/or pigments can also be included in the adhesive compositions. Cutting agents such as waxes and surfactants also can be included in the adhesives. Light stabilizers, heat stabilizers, and UV absorbers or blockers also can be included in the adhesive compositions. Ultraviolet absorbers include benzotriazol derivatives, hydroxy benzyl phenones, esters of benzoic acids, oxalic acid, diamides, etc. Light stabilizers include hindered amine light stabilizers, and the heat stabilizers include dithiocarbamate compositions such as zinc dibutyl dithiocarbamate, although other stabilizers may be suitable. The adhesive materials can contain a mixture of solid tackifying resins and liquid tackifying resins. In a particular aspect, a pressure sensitive adhesive can be based on an elastomer compounded with a suitable tackifier (e.g., a rosin ester).

The pressure sensitive adhesive can be applied to the film by using standard coating techniques, such as curtain coating, gravure coating, reverse gravure printing, offset gravure printing, roller coating printing, brushing, knife-over-roll coating, air-brush roller coating, metering-roller coating, reverse roll coating, roller coating with bottom-action doctor blade, immersion, jet coating, spraying and the like.

Commercially available examples of suitable protective films include Avery Dennison PPF CH028 paint protection film and Haartz DefenZall™ PPF paint protection film. These protective films are typically commercially provided with the adhesive and removable backing in place. The Avery film is an optically clear urethane film with a proprietary pressure sensitive adhesive layer. The urethane film is also nanofusion treated. The Haartz film is a 0.006" aliphatic TPU with an outer topcoat layer, a 0.002" acrylic adhesive layer, and a bleached kraft release liner.

Figure 3:
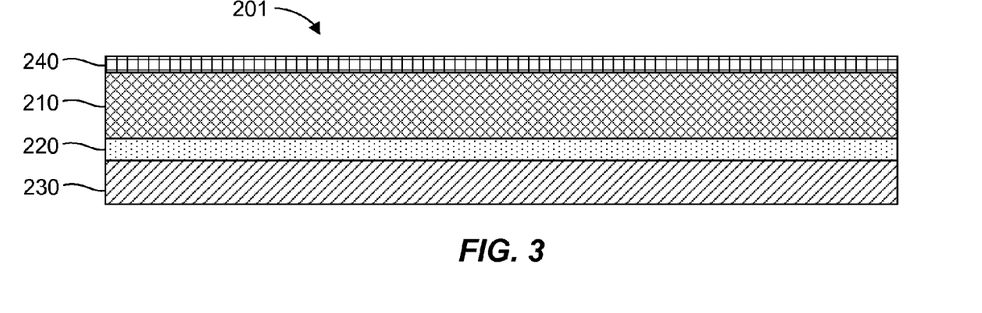
FIG. 3 is a cross-section of a protective film assembly, in accordance with another example of the present disclosure.

With reference to FIG. 3, illustrated is a protective film assembly 201, in accordance with another example of the present disclosure. As with the protective film assembly illustrated in FIG. 2, an adhesive 220 can be disposed on a protective film 210 and a backing 230 can cover the adhesive. Additionally, a removable cap sheet 240 can be included to cover and protect the protective film during shipping and handling of the film and during application of the protective film to a device. The cap sheet can be any suitable material that facilitates application of the protective film to a device while also providing protection for the protective film from cuts and/or abrasions. In one aspect, the cap sheet is optically clear to allow a user to see through the cap sheet while applying the protective film to a device. This can facilitate alignment of the protective film with the device. The cap sheet can also add rigidity to the malleable films thereby easing the installation process of the film, especially during a dry-application of the film to the device.

Figure 4:
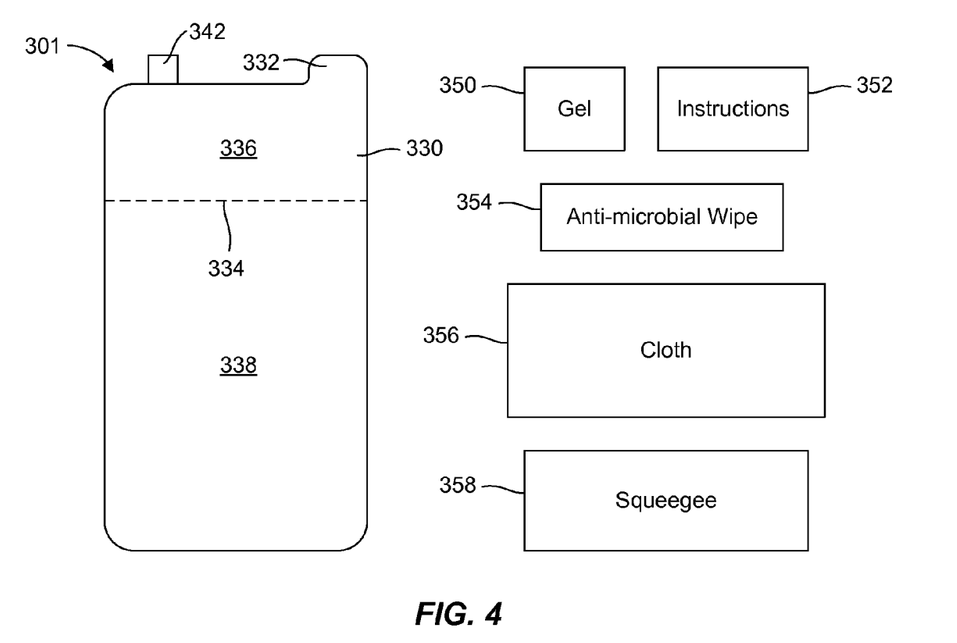
FIG. 4 is a kit for protecting a device, in accordance with an example of the present disclosure.

Illustrated in FIG. 4 is a kit 300 for protecting a device. The kit 300 can comprise a protective film assembly 301, as described hereinabove, having a protective film (hidden from view and coplanar with a backing sheet 330), an adhesive (also hidden from view), the backing sheet 330, and a cap sheet (hidden from view). The kit can also comprise a gel packet 350 containing gel for optionally applying to the adhesive. The kit can further comprise an instruction sheet 352 for providing instructions for a dry application of the protective film to the device through direct attachment and instructions for a wet application of the protective film to the device using the gel. In one aspect, the kit can comprise an antimicrobial wipe 354 and/or a cloth 356 for cleaning the device prior to applying the protective film, and/or a squeegee 358 for applying the protective film to remove air bubbles or non-uniformities in the film.

The backing 330 can include a tab 332 which extends beyond the protective film to facilitate removal of the backing from at least a portion of the protective film, generally in a dry application, or to facilitate removal of the entire backing from the protective film, generally in a wet application. The tab can be an integral part of the backing or the tab can be a separate component attached to the backing, such as with an adhesive. Thus, in some embodiments, the kit 300 can include a separate tab 332 for coupling with the backing to facilitate removal of the backing from the protective film. In one aspect, the backing can include a cut or perforation 334 defining a cut out 336 that can be separated from the protective film while a remaining portion 338 of the backing remains coupled to the protective film. The cut out can allow a user to peel off a portion of the backing to expose the adhesive on the protective film that was covered by the cut out. In other words, the cut out can allow a portion of the backing to be removed from the protective film while maintaining a remaining portion of the backing on the protective film. For example, a smaller portion of the backing can be removed to expose adhesive of a first portion of the protective film. The first portion of the protective film can be disposed on or applied to a device. By exposing only a portion of the adhesive, the remaining portion of the backing can enable a user to more easily position or align the protective film before application to the device. When aligned, the remaining portion of the backing can then be removed to expose adhesive of the remaining portion of the protective film for application to the device. Although the backing may be cut to form a cut out, the film itself may not be cut or marked. In some examples, the backing is cut independently of the protective film in order to avoid cutting or marking of the protective film during the manufacturing process. Alternatively, the backing can include a foldable portion which is optionally marked with a line or other indicia, creased, perforated or otherwise allowed to preferentially fold across the backing to allow exposure of a selected portion of the adhesive.

The cap sheet (shown as item 240 in FIG. 3) can include a tab 342 extending beyond the protective film to facilitate removal of the cap sheet from the protective film, such as following application of the protective film to a device. The tab can be an integral part of the cap sheet or the tab can be a separate component attached to the cap sheet, such as with an adhesive. Thus, in some embodiments, the kit 300 can include a separate tab 342 for coupling with the cap sheet to facilitate removal of the cap sheet from the protective film.

The optional gel can delay bonding of the adhesive layer such that repositioning of the protective film can be made by simply sliding the film around the device surface to achieve a desired alignment. The gel can comprise water and alcohol and can be configured to allow for bonding of the protective film to the surface of the device. For example, the gel can act as an adhesive solvent to delay bonding of the protective film to the device until dried. In one embodiment, the gel can comprise water, an alcohol, and a heterocyclic compound. In one aspect, the alcohol can be $C_1$ to $C_8$ alcohol, and in one particular aspect, can be isopropyl alcohol. In another aspect, the heterocyclic compound can contain a thiol moiety, an amine moiety, an amide moiety, or combinations thereof. In one specific aspect, the heterocyclic compound can by an isothiazolinone compound or combination of isothiazolinone compounds. In one embodiment, the gel can further comprise a salt or mixture of salts. In one aspect, the salt can be a magnesium salt. In one embodiment, the gel can further comprise acrylates including polymers thereof. In one specific embodiment, the gel comprises water, isopropyl alcohol, tromethamine, PEG-180, acrylates (C10-30) alkyl acrylate copolymer, methyl chloroisothiazolinone, methyl isothiazolinone, magnesium chloride, and magnesium nitrate. Further, pH of the gel can be from about 6.5 to about 7.0 although other pH may be functional. In one alternative aspect, the viscosity of the gel can be from about 4500 to about 5100 cp at room temperature.

The anti-microbial wipe 354 can include any suitable anti-microbial, such as those disclosed hereinabove. The cloth 356 can be configured to contact surfaces of the device and the protective film without abrading the surfaces. In one aspect, the cloth comprises a microfiber fabric, although other materials such as cotton or synthetic textiles can be suitable. The squeegee 358 can comprise a flat surface or edge, such as on a plastic card, configured to slide across the protective film to facilitate adhesion of the protective film to the device and/or to facilitate removal of air bubbles from between the protective film and the device. In one aspect, the cloth can be configured to wrap around at least a portion of the flat surface or edge of the squeegee to facilitate sliding of the squeegee across the surface of the protective film without abrading the protective film.

FIGS. 5-9 are graphical illustrations for applying a protective film to a device, such as using the kit 300 of FIG. 4 described hereinabove. Prior to the steps illustrated in FIGS. 5-9, the microbial wipe 354 and/or the cloth 356 can be used to clean the device. For example, before application of the protective film, the electronic device may be turned off and thoroughly cleaned. Typically, all dust, dirt, and other contaminants should be removed from the device before installation so that contaminants are not trapped between the protective film and the device. Residual debris will often create undesirable visual effects which may be distracting during use or even may compromise device performance. A user applying the protective film may also wash his or her hands to ensure that fingerprints are not left on the device or protective film during installation.

Figure 5:
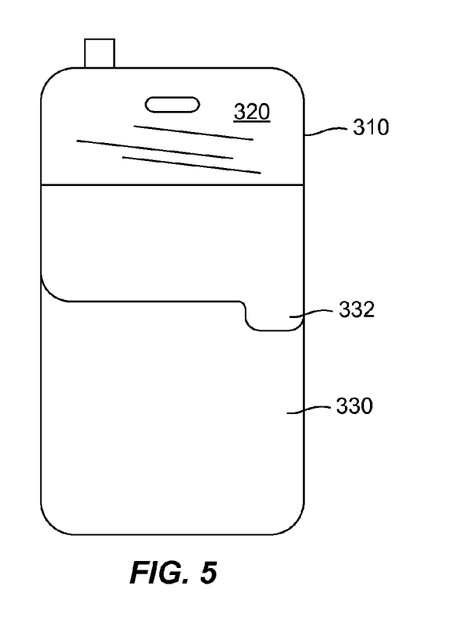
FIGS. 5-9 illustrate steps of using the kit of FIG. 4 to apply a protective film to a device, in accordance with an example of the present disclosure.
Figure 6:
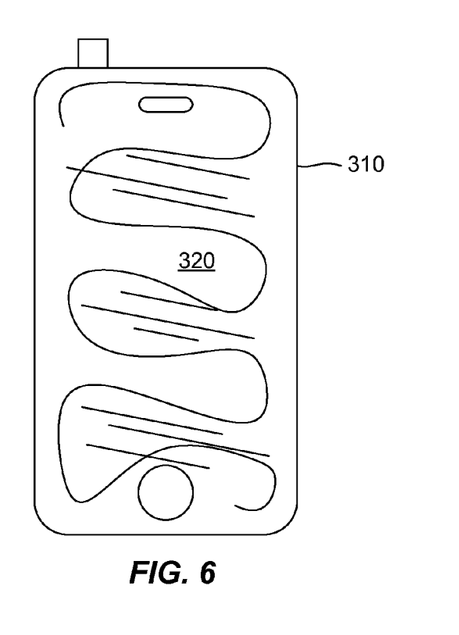

As shown in FIG. 5, once the device has been cleaned, the backing 330 can be removed from the adhesive 320 on the protective film 310 by pulling on tab 332. For a wet application, the entire backing can be removed to expose the adhesive side of the protective film. With the adhesive layer exposed, gel from the gel packet 350 can be applied to the entire adhesive side of the protective film, as shown in FIG. 6.

Figure 7:
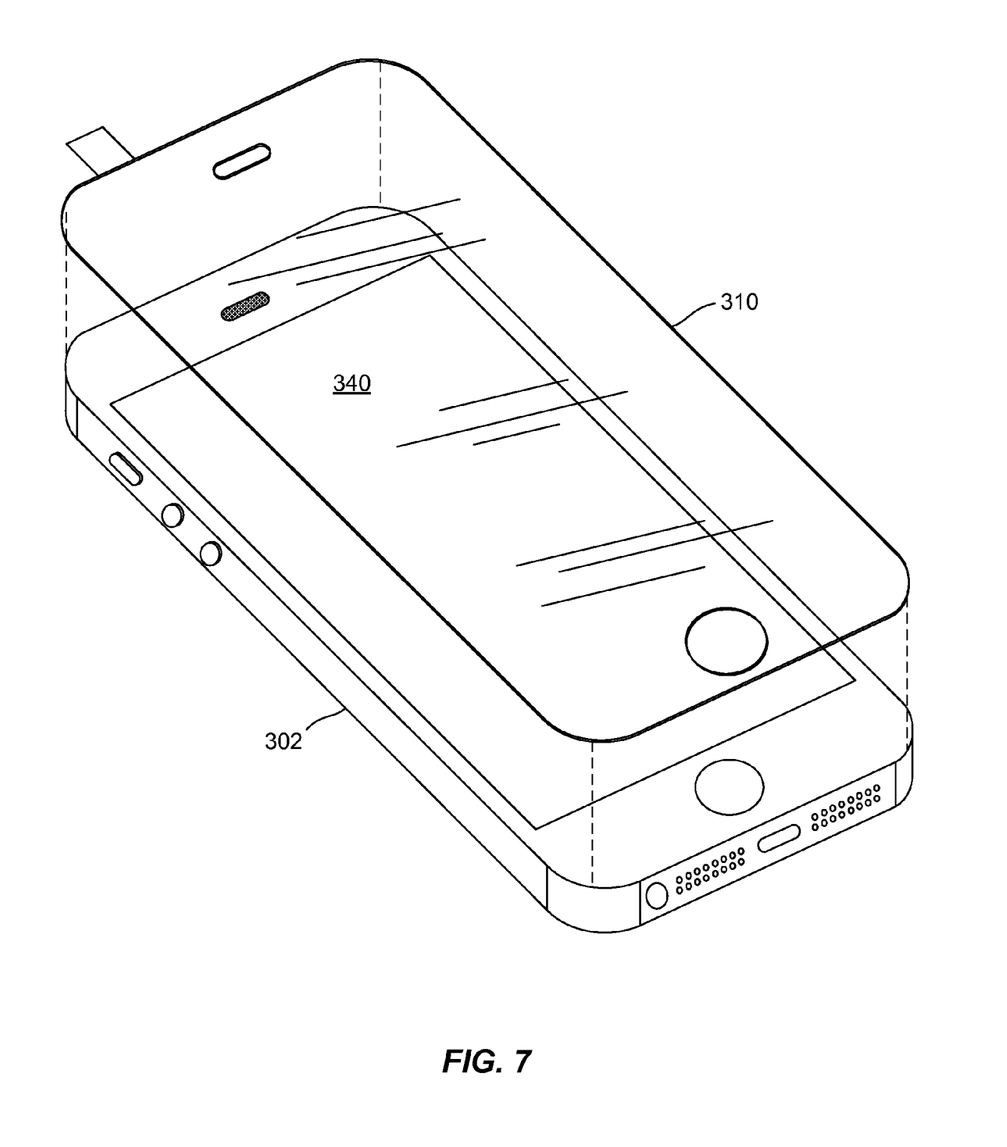
Figure 8:
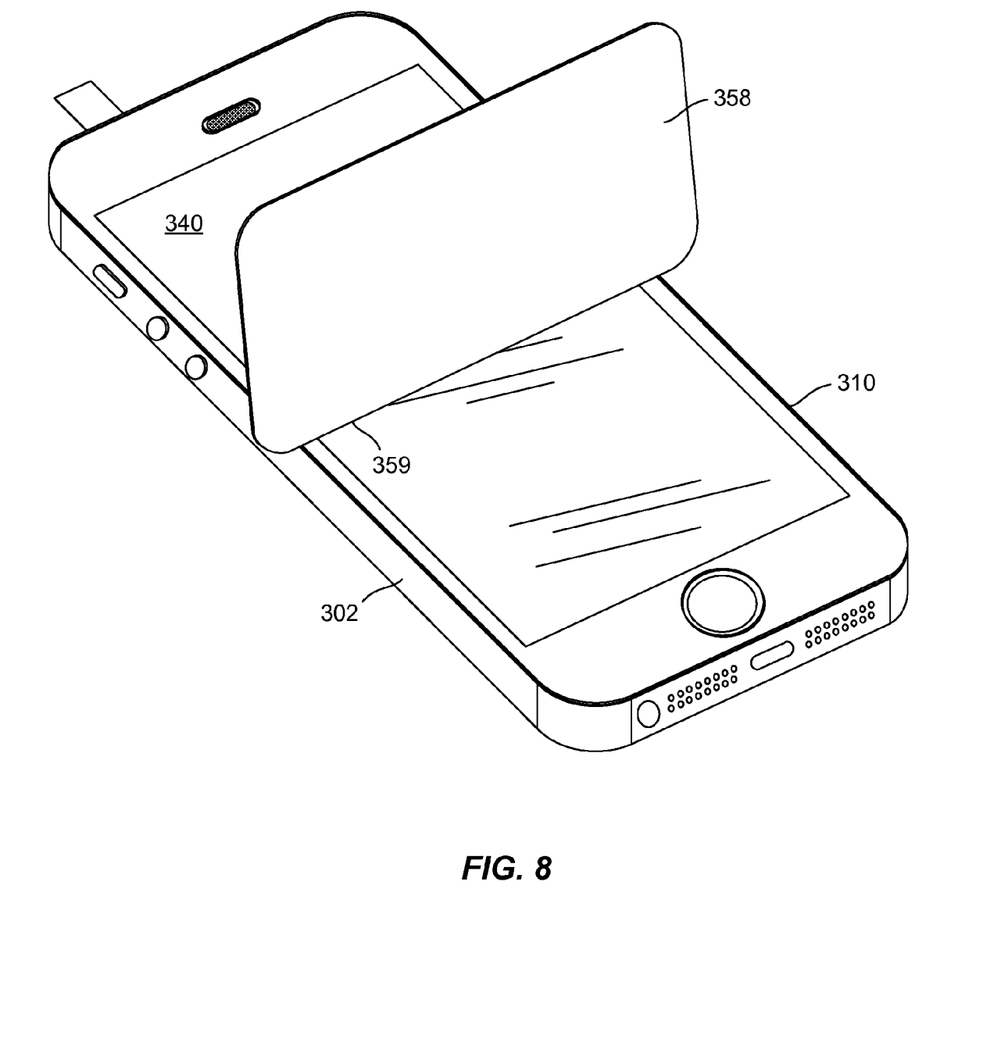

FIG. 7 illustrates aligning the protective film 310 with a device 302. Note that the adhesive side, with gel, is facing the device. The cap sheet is still on the opposite side of the protective film 310. The protective film and/or cap sheet can have aligning key reference points to assist the user in properly aligning the protective film on the device. Once the protective film has been aligned with the device, the protective film can be brought into contact with the device, as shown in FIG. 8. The gel provides a certain amount of time for fine-tuning the alignment to achieve a desired position of the protective film on the device. If it becomes necessary or desirable to remove the protective film from the device prior to completing the protective film application, for example, to achieve a better alignment, gel can be reapplied to any portion of the adhesive side that came into contact with the device and then the protective film can again be brought into contact with the device to complete the application process. Regarding a wet application, if the exposed part of the protective film is not aligned properly, the user may realign the film by pressing the film laterally to slide across the surface. One advantage of the wet application process is to allow such repositioning. If needed, the user can remove the film from the device, optionally apply additional gel, and realign the film.

FIG. 8 illustrates use of the squeegee 358 to press the protective film 310 into contact with the device 302 following any fine-tuning alignment of the protective film on the device. The squeegee 358 can also be used to press air bubbles trapped between the protective film and the device toward an outer edge of the protective film. In one aspect (not shown), the cloth 356 can be placed between the squeegee and the protective film, such as by wrapping around a contact surface 359 or edge of the squeegee to facilitate sliding of the squeegee across the protective film. In addition to protecting the protective film during application, the cap sheet 340 can also facilitate sliding of the cloth and/or squeegee across the protective film.

In one aspect, when the protective film 310 is aligned correctly, the user can secure the exposed adhesive part of the protective film to the device 302 by rubbing the exposed part with his or her fingers or using a mechanical device such as the squeegee 358. The squeegee can comprise a card that can be provided by the user or with the product. As the user secures the protective film, the user can work out any bubbles that may be trapped between the protective film and the device by pushing the bubbles to the edge using the squeegee or fingers. For example, the squeegee can be used to press the film to the device surface with firm, overlapping strokes, making sure accurate alignment is maintained. Use of the squeegee can be repeated until all air is removed from beneath the protective film and proper edge bonding is achieved. Typically, the protective film is properly aligned before the user begins use of the squeegee to secure the exposed adhesive part of the protective film to the device.

Figure 9:
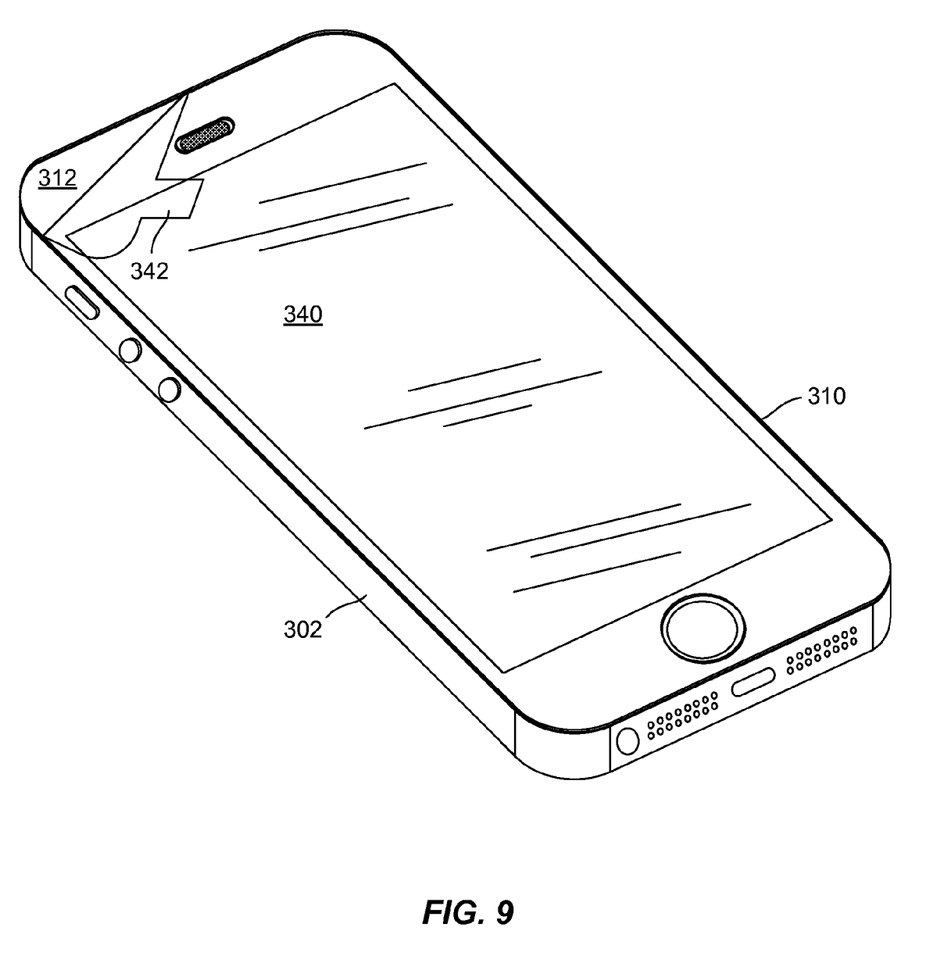

As shown in FIG. 9, once the protective film 310 has been pressed into contact with the device 302 and any air bubbles have been removed, the cap sheet 340 can be removed by pulling on tab 342. This will reveal a top surface 312 or exposed surface of the protective film and application of the protective film is complete. It is noted that no specific order is required in the steps shown and described with regard to FIGS. 5-9, though generally in one embodiment, these steps can be carried out sequentially.

Figure 10:
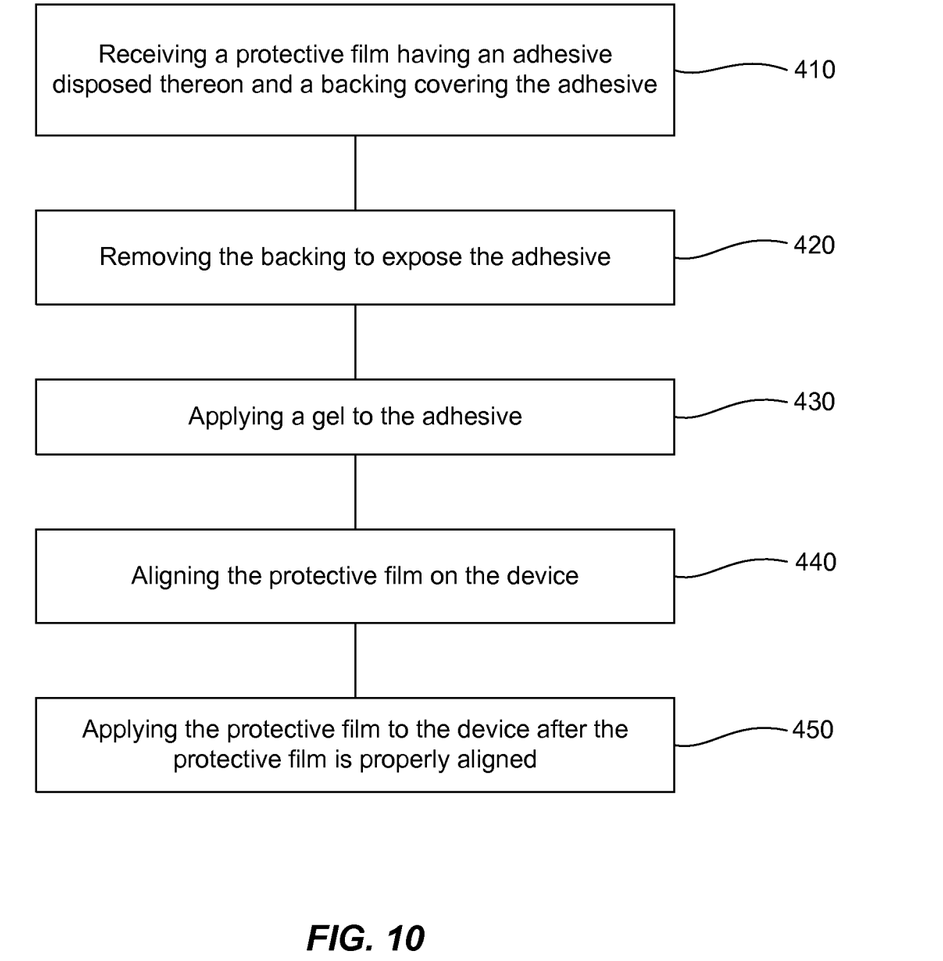
FIG. 10 is a schematic diagram of a method for applying a protective film to a device, in accordance with an example of the present disclosure.

With reference to FIG. 10, a block diagram is shown illustrating a method for applying protective film to a device. For example, the method can comprise obtaining a protective film having an adhesive disposed thereon and a backing covering the adhesive 410. The method can also comprise removing the backing to expose the adhesive 420. The method can further comprise applying a gel to the adhesive 430. Still further, the method can comprise aligning the protective film on the device 440. Additionally, the method can comprise applying the protective film to the device after the protective film is properly aligned 450. In one aspect, the method for applying protective film to a device can further comprise applying pressure to the protective film to remove any bubbles between the protective film and the adhesive. In another aspect, the method can further comprise realigning the protective film on the device and/or reapplying the protective film to the device. It is noted that no specific order is required in this method, though generally in one embodiment, these method steps can be carried out sequentially. Additionally, the method can further comprise removing a cap sheet from the protective film.

Figure 11:
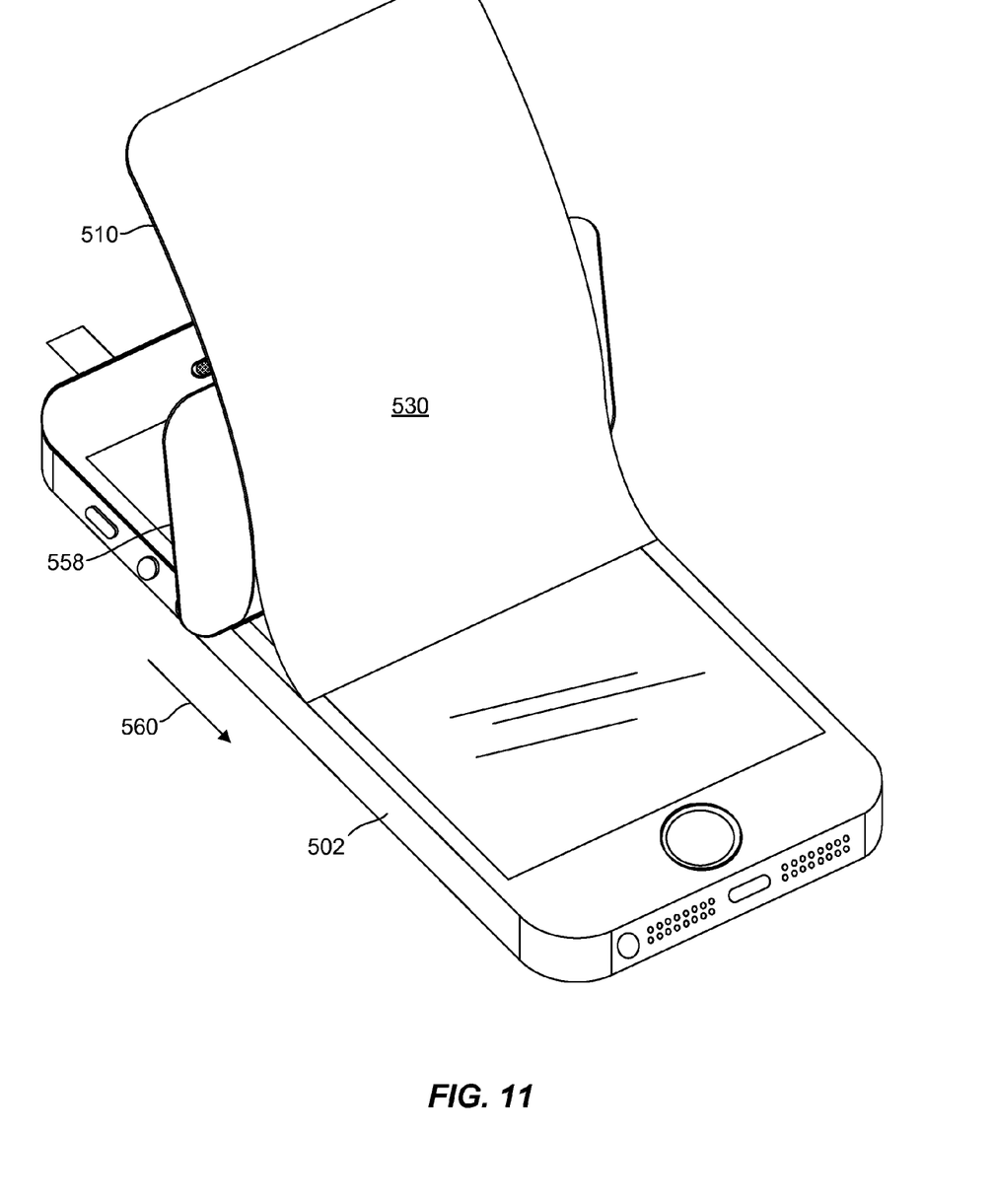
FIG. 11 illustrates a dry application of a protective film to a device, in accordance with an example of the present disclosure.

Regarding a dry application, as illustrated in FIG. 11, when the exposed adhesive portion of the protective film 510 has been secured to the device 502, the remaining portion that is still secured to the backing 530 can be flipped onto itself so the backing is facing up. The user can place his/her fingers or a mechanical device such as a squeegee 558 inside the bend created by flipping the protective film onto itself and apply pressure to the protective film. As pressure is applied, the user may move his/her fingers or the mechanical device slowly along the device in direction 560 in order to apply the remaining portion of the protective film. The remaining portion of the backing will begin to separate from the protective film as the film is applied to the device. Use of pressure can prevent bubbles from forming as the protective film is applied. As the user slowly applies the remaining portion of the protective film, the user can simultaneously remove the backing portion until the protective film is fully adhered to the device.

Regarding a wet application, the protective film can be initially aligned to the surface of the device and applied to the device. However, upon application, the protective film can be repositioned while on the device due to the gel interface. Additionally, in some cases, the protective film can be removed and reapplied prior to the drying of the gel to correct positioning or air entrapment.

Alternately, when the protective film is applied, the user can use a mechanical device to remove any bubbles between the protective film and the device by working the bubbles out to the sides of the device. Bubbles that are difficult to remove may settle and remove on their own within several hours to several days of applying the protective film.

The foregoing detailed description describes the invention with reference to specific exemplary embodiments. However, it will be appreciated that various modifications and changes can be made without departing from the scope of the present invention as set forth in the appended claims. The detailed description and accompanying drawings are to be regarded as merely illustrative, rather than as restrictive, and all such modifications or changes, if any, are intended to fall within the scope of the present invention as described and set forth herein.

More specifically, while illustrative exemplary embodiments of the invention have been described herein, the present invention is not limited to these embodiments, but includes any and all embodiments having modifications, omissions, combinations (e.g., of aspects across various embodiments), adaptations and/or alterations as would be appreciated by those skilled in the art based on the foregoing detailed description. The limitations in the claims are to be interpreted broadly based on the language employed in the claims and not limited to examples described in the foregoing detailed description or during the prosecution of the application, which examples are to be construed as non-exclusive. Any steps recited in any method or process claims may be executed in any order and are not limited to the order presented in the claims. Accordingly, the scope of the invention should be determined solely by the appended claims and their legal equivalents, rather than by the descriptions and examples given above.

What is claimed is:

1. A method for applying protective film to a device, the method comprising:
   obtaining a protective film having an adhesive disposed thereon and a backing covering the adhesive;
   removing the backing to expose the adhesive;
   applying a gel to the adhesive to temporarily deactivate bonding of the protective film;
   aligning the protective film on the device; and
   applying the protective film to the device after the protective film is properly aligned.

2. The method of claim 1, wherein the gel comprises water, an alcohol, and a heterocyclic compound.

3. The method of claim 1, wherein the protective film comprises urethane, polyurethane, polyvinyl chloride, optically clear chlorinated polymer, polyester, polyethylene terephthalate, or combinations thereof.

4. The method of claim 1, wherein the protective film is optically clear prior to application to the device.

5. The method of claim 1, wherein the adhesive comprises a pressure sensitive adhesive.

6. The method of claim 1, wherein the adhesive comprises acrylic based polymers, acrylic emulsion polymers, natural elastomeric polymers, synthetic elastomeric polymers, elastomeric copolymer microspheres, or combinations thereof.

7. The method of claim 1, wherein the protective film further comprises a cap sheet and the method further comprises removing the cap sheet from the protective film.

8. The method of claim 1, wherein the protective film has anti-microbial properties on an exposed surface of the protective film.

9. The method of claim 1, wherein the device comprises a cell phone or a tablet.

* * * * *